(12) United States Patent
Oh

(10) Patent No.: US 8,754,688 B2
(45) Date of Patent: Jun. 17, 2014

(54) SIGNAL OUTPUT CIRCUIT AND SEMICONDUCTOR DEVICE INCLUDING THE SAME

(75) Inventor: Ic-Su Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/607,941

(22) Filed: Sep. 10, 2012

(65) Prior Publication Data

US 2013/0162314 A1 Jun. 27, 2013

(30) Foreign Application Priority Data

Dec. 22, 2011 (KR) ........................ 10-2011-0140485

(51) Int. Cl.
*H01H 9/56* (2006.01)
*H03K 5/08* (2006.01)
*H03K 5/1536* (2006.01)

(52) U.S. Cl.
USPC ........... 327/162; 327/108; 327/109; 327/110; 327/111; 327/112

(58) Field of Classification Search
USPC .......................................... 327/108–112, 162
See application file for complete search history.

(56) References Cited

U.S. PATENT DOCUMENTS

| | | | |
|---|---|---|---|
| 2009/0058474 A1* | 3/2009 | Kim | 327/108 |
| 2009/0102528 A1* | 4/2009 | Sumita | 327/163 |
| 2011/0148475 A1* | 6/2011 | Lin et al. | 327/109 |
| 2011/0267112 A1* | 11/2011 | Lee et al. | 327/108 |
| 2012/0169380 A1* | 7/2012 | Kang | 327/108 |
| 2013/0015887 A1* | 1/2013 | Piselli et al. | 327/109 |
| 2013/0162314 A1* | 6/2013 | Oh | 327/162 |
| 2013/0194006 A1* | 8/2013 | Yamamoto | 327/109 |
| 2013/0234760 A1* | 9/2013 | Wang et al. | 327/108 |

FOREIGN PATENT DOCUMENTS

| | | |
|---|---|---|
| KR | 1020090048888 | 5/2009 |
| KR | 101030275 | 4/2011 |
| KR | 101053543 | 8/2011 |

\* cited by examiner

*Primary Examiner* — Adam Houston
(74) *Attorney, Agent, or Firm* — IP & T Group LLP

(57) ABSTRACT

A signal output circuit includes a signal transfer unit configured to transfer a signal of a first line to a pull-up line during an activation period of a first clock, transfer the signal of the first line to a pull-down line during a deactivation period of a second clock, transfer a signal of a second line to the pull-up line during a deactivation period of the first clock, and transfer the signal of the second line to the pull-down line during an activation period of the second clock; and an output driving unit configured to pull-up drive an output node in response to a signal of the pull-up line and pull-down drive the output node in response to a signal of the pull-down line, wherein the first clock and the second clock have the activation periods longer than the deactivation periods.

19 Claims, 5 Drawing Sheets

SIGNAL OUTPUT CIRCUIT AND SEMICONDUCTOR DEVICE INCLUDING THE SAME

CROSS-REFERENCE TO RELATED APPLICATIONS

The present application claims priority of Korean Patent Application No. 10-2011-0140485, filed on Dec. 22, 2011, which is incorporated herein by reference in its entirety.

BACKGROUND

1. Field

Exemplary embodiments of the present invention relate to a signal output circuit and a semiconductor device.

2. Description of the Related Art

As mass society is developing rapidly, demands for various electronic equipments capable of high speed processing of high capacity data have been abruptly increased. As a measure for high speed processing of high capacity data in such electronic equipments, a semiconductor memory device is used. For example, a DDR (double data rate) semiconductor memory device is mainly used. Unlike the existing SDR (single data rate) semiconductor memory device, the DDR semiconductor memory device operates in synchronization with both the rising edge and the fall edge of a clock. In such a semiconductor memory device, a data output circuit including a driver for stably outputting data is used.

FIG. 1 is a configuration diagram of a conventional data output circuit.

Referring to FIG. 1, the data output circuit includes a pull-up transfer unit 110, a pull-down transfer unit 120, and an output driving unit 130.

Hereinafter, operations of the data output circuit will be described with reference to FIG. 1.

The pull-up transfer unit 110 is configured to transfer the data of a first line RDO to a pull-up line PUL during the activation period (e.g., high level period) of a rising clock RCLK and transfer the data of a second line FDO to the pull-up line PUL during the activation period (e.g., high level period) of a falling clock FCLK. The rising edge of the rising clock RCLK is synchronized with the rising edge of a system clock CLK which is used in a memory system, and the rising edge of the falling clock FCLK is synchronized with the falling edge of the system clock CLK. Accordingly, the rising clock RCLK and the falling clock FCLK are in an inverted relationship with respect to each other.

The pull-down transfer unit 120 is configured to transfer the data of the first line RDO to a pull-down line PDL during the activation period (e.g., high level period) of the rising clock RCLK and transfer the data of the second line FDO to the pull-down line PDL during the activation period (e.g., high level period) of the falling clock FCLK. The first line RDO is a line through which the data to be outputted in synchronization with the rising edge of the system clock CLK is transferred, and the second line FDO is a line through which the data to be outputted in synchronization with the falling edge of the system clock CLK is transferred (the data are transferred to the data output circuit through the lines RDO and FDO).

The output driving unit 130 is configured to pull-up drive an output node OUT in response to the signal of the pull-up line PUL or pull-down drive the output node OUT in response to the signal of the pull-down line PDL. The output driving unit 130 may include a PMOS transistor P having one end which is connected to the output node OUT, the other end to which a power supply voltage VDD is applied and a gate to which the signal of the pull-up line PUL is inputted and an NMOS transistor N having one end which is connected to the output node OUT, the other end to which a ground voltage VSS is applied and a gate to which the signal of the pull-down line PDL is inputted.

Hereinafter, entire operations of the data output circuit will be exemplarily described with reference to FIG. 1.

First, in the case where the high level data of the first line RDO is outputted during the activation period of the rising clock RCLK, since the data of the first line RDO is transferred to the pull-up line PUL and the pull-down line PDL by the pull-up transfer unit 110 and the pull-down transfer unit 120, respectively, the signals of the pull-up line PUL and the pull-down line PDL become high levels. Therefore, since the PMOS transistor P is turned off and the NMOS transistor N is turned on, the output node OUT is pull-down driven, and low level data acquired through inversion of the high level data of the first line RDO is outputted to the output node OUT.

Next, in the case where the low level data of the second line FDO is outputted during the activation period of the falling clock FCLK, since the data of the second line FDO is transferred to the pull-up line PUL and the pull-down line PDL by the pull-up transfer unit 110 and the pull-down transfer unit 120, respectively, the signals of the pull-up line PUL and the pull-down line PDL become low levels. Therefore, since the PMOS transistor P is turned on and the NMOS transistor N is turned off, the output node OUT is pull-up driven, and high level data acquired through inversion of the low level data of the second line FDO is outputted to the output node OUT.

The duty ratios between the high level periods and the low level periods of the rising clock RCLK and the falling clock FCLK, which are used to transfer the data of the first line RDO and the second line FDO to the pull-up line PUL and the pull-down line PDL, is near to 1:1. Hereinafter, it will be described with reference to FIG. 2 that data are transferred to the output driving unit 130 using the clocks RCLK and FCLK with duty ratios of 1:1.

FIG. 2 is a waveform diagram illustrating operations of the data output circuit shown in FIG. 1.

FIG. 2 shows the case where high level data is applied to the first line RDO and low level data is applied to the second line FDO such that the data of the first line RDO and the data of the second line FDO are alternately outputted by being inverted. In the high level period of the system clock CLK, the high level data of the first line RDO is outputted by being inverted, and in the low level period of the system clock CLK, the low level data of the second line FDO is outputted by being inverted.

Referring to FIG. 2, during the activation period of the rising clock RCLK, since the high level data of the first line RDO is transferred to the pull-up line PUL and the pull-down line PDL, the logic values of the signals of the pull-up line PUL and the pull-down line PDL become high. Accordingly, the PMOS transistor P is turned off and the NMOS transistor N is turned on, by which the output node OUT is pull-down driven (the low level data acquired through inversion of the high level data of the first line RDO is outputted). Further, during the activation period of the falling clock FCLK, since the low level data of the second line FDO is transferred to the pull-up line PUL and the pull-down line PDL, the logic values of the signals of the pull-up line PUL and the pull-down line PDL become low. Accordingly, the PMOS transistor P is turned on and the NMOS transistor N is turned off, by which the output node OUT is pull-up driven (the high level data acquired through inversion of the low level data of the second line FDO is outputted).

In this regard, because the duty ratios of the rising clock RCLK and the falling clock FCLK are 1:1, the waveforms of the signal of the pull-up line PUL and the signal of the pull-down line PDL are substantially the same as shown in FIG. 2. Thus, the rising edges and the falling edges of the signals of the pull-up line PUL and the pull-down line PDL overlap with each other. Due to this fact, the PMOS transistor P and the NMOS transistor N are likely to be simultaneously turned on. If the PMOS transistor P and the NMOS transistor N are simultaneously turned on, short current may flow between a power supply voltage terminal 101 and a ground voltage terminal 102 and power consumption of the data output circuit may increase.

SUMMARY

An embodiment of the present invention is directed to a signal output circuit which prevents activation periods of a pull-down driving unit and a pull-up driving unit for driving an output node from overlapping with each other, thereby reducing power consumption due to short current.

In accordance with an exemplary embodiment of the present invention, a signal output circuit includes: a signal transfer unit configured to transfer a signal of a first line to a pull-up line during an activation period of a first clock, transfer the signal of the first line to a pull-down line during a deactivation period of a second clock, transfer a signal of a second line to the pull-up line during a deactivation period of the first clock, and transfer the signal of the second line to the pull-down line during an activation period of the second clock; and an output driving unit configured to pull-up drive an output node in response to a signal of the pull-up line and pull-down drive the output node in response to a signal of the pull-down line, wherein the first clock and the second clock have the activation periods longer than the deactivation periods.

In accordance with another exemplary embodiment of the present invention, a signal output circuit includes: a duty ratio control unit configured to generate a first clock and a second clock by controlling a duty ratio of a reference clock and a duty ratio of an inverted clock of the reference clock, respectively; a signal transfer unit configured to transfer a signal of a first line to a pull-up line during an activation period of the first clock, transfer the signal of the first line to a pull-down line during a deactivation period of the second clock, transfer a signal of a second line to the pull-up line during a deactivation period of the first clock, and transfer the signal of the second line to the pull-down line during an activation period of the second clock; and an output driving unit configured to pull-up drive an output node in response to a signal of the pull-up line and pull-down drive the output node in response to a signal of the pull-down line, wherein the first clock and the second clock have the activation periods longer than the deactivation periods.

In accordance with another embodiment of the present invention, a signal output circuit includes: a signal transfer unit configured to transfer a signal of a first line to a preliminary pull-up line during an activation period of a first clock, transfer the signal of the first line to a preliminary pull-down line during a deactivation period of a second clock, transfer a signal of a second line to the preliminary pull-up line during a deactivation period of the first clock, and transfer the signal of the second line to the preliminary pull-down line during an activation period of the second clock; a preliminary pull-up driving unit configured to drive a signal of the preliminary pull-up line to a pull-up line with a driving force determined by first codes; a preliminary pull-down driving unit configured to drive a signal of the preliminary pull-down line to a pull-down line with a driving force determined by second codes; and an output driving unit configured to pull-up drive an output node in response to a signal of the pull-up line and pull-down drive the output node in response to a signal of the pull-down line, wherein the first clock and the second clock have the activation periods longer than the deactivation periods.

In accordance with another embodiment of the present invention, a signal output circuit includes: a duty ratio control unit configured to generate a first clock and second clock by controlling a duty ratio of a reference clock and a duty ratio of an inverted clock of the reference clock, respectively; a signal transfer unit configured to transfer a signal of a first line to a preliminary pull-up line during an activation period of the first clock, transfer the signal of the first line to a preliminary pull-down line during a deactivation period of the second clock, transfer a signal of a second line to the preliminary pull-up line during a deactivation period of the first clock, and transfer the signal of the second line to the preliminary pull-down line during an activation period of the second clock; a preliminary pull-up driving unit configured to drive a signal of the preliminary pull-up line to a pull-up line with a driving force determined by first codes; a preliminary pull-down driving unit configured to drive a signal of the preliminary pull-down line to a pull-down line with a driving force determined by second codes; and an output driving unit configured to pull-up drive an output node in response to a signal of the pull-up line and pull-down drive the output node in response to a signal of the pull-down line, wherein the first clock and the second clock have the activation periods longer than the deactivation periods.

In accordance with yet another embodiment of the present invention, a semiconductor device includes: a signal transfer circuit configured to transfer a first signal to a first line and a second signal to a second line in synchronization with a reference clock when an enable signal is applied; a duty ratio control unit configured to generate a first clock and second clock by controlling a duty ratio of a reference clock and a duty ratio of an inverted clock of the reference clock, respectively; a signal transfer unit configured to transfer a signal of the first line to a pull-up line during an activation period of the first clock, transfer the signal of the first line to a pull-down line during a deactivation period of the second clock, transfer a signal of the second line to the pull-up line during a deactivation period of the first clock, and transfer the signal of the second line to the pull-down line during an activation period of the second clock; and an output driving unit configured to pull-up drive an output node in response to a signal of the pull-up line and pull-down drive the output node in response to a signal of the pull-down line, wherein the first clock and the second clock have the activation periods longer than the deactivation periods.

In accordance with still another embodiment of the present invention, a semiconductor device includes: a signal transfer circuit configured to transfer a first signal to a first line and a second signal to a second line in synchronization with a reference clock when an enable signal is applied; a duty ratio control unit configured to generate a first clock and a second clock by controlling a duty ratio of a reference clock and a duty ratio of an inverted clock of the reference clock, respectively; a signal transfer unit configured to transfer a signal of the first line to a preliminary pull-up line during an activation period of the first clock, transfer the signal of the first line to a preliminary pull-down line during a deactivation period of the second clock, transfer a signal of the second line to the preliminary pull-up line during a deactivation period of the first clock, and transfer the signal of the second line to the preliminary pull-down line during an activation period of the second clock; a preliminary pull-up driving unit configured to drive a signal of the preliminary pull-up line to a pull-up line with a driving force determined by first codes; a preliminary pull-down driving unit configured to drive a signal of the preliminary pull-down line to a pull-down line with a driving force determined by second codes; and an output driving unit configured to pull-up drive an output node in response to a signal of the pull-up line and pull-down drive the output node in response to a signal of the pull-down line, wherein the first clock and the second clock have the activation periods longer than the deactivation periods.

DETAILED DESCRIPTION

Figure 1:
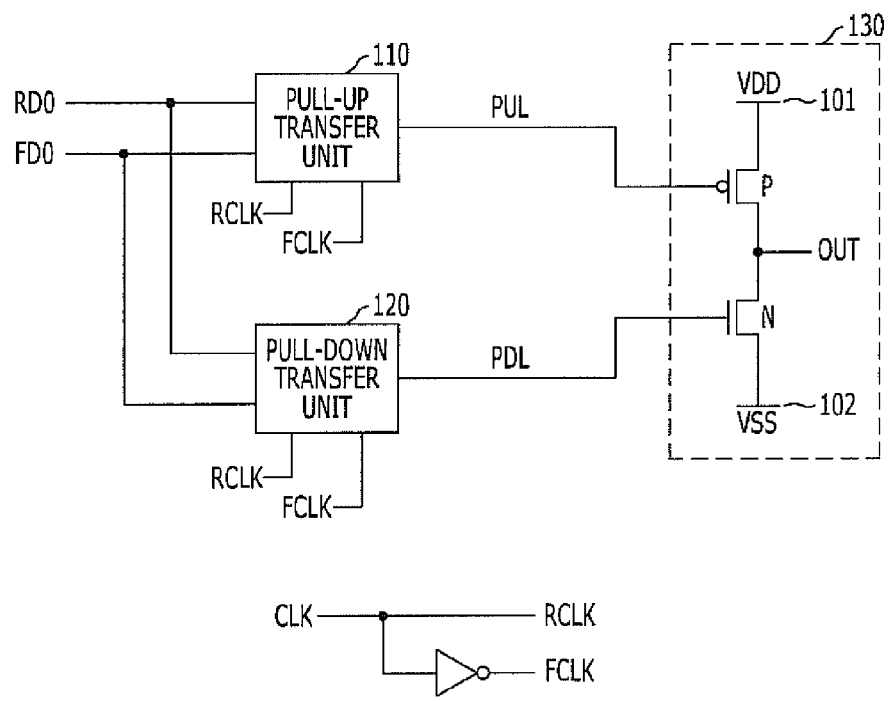
FIG. 1 is a configuration diagram of a conventional data output circuit.
Figure 2:
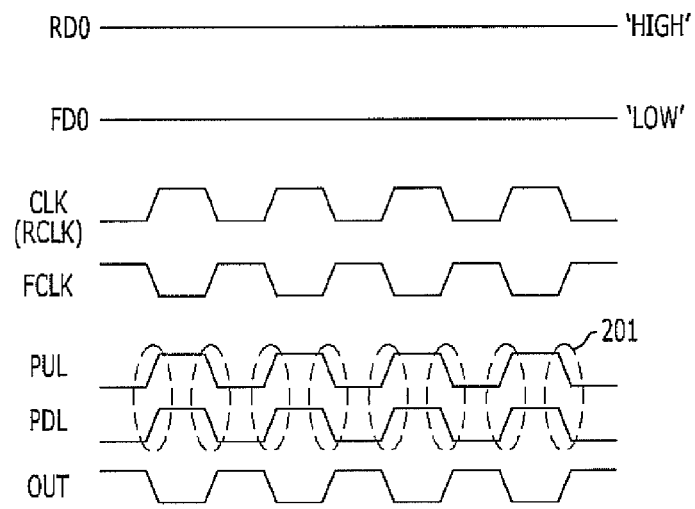
FIG. 2 is a waveform diagram illustrating operations of the data output circuit shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, it is described as an example that the activation period of a clock signal corresponds to the high level period of the clock signal, and the deactivation period of the clock signal corresponds to the low level period of the clock signal. However, this may be changed depending upon different designs.

Figure 3:
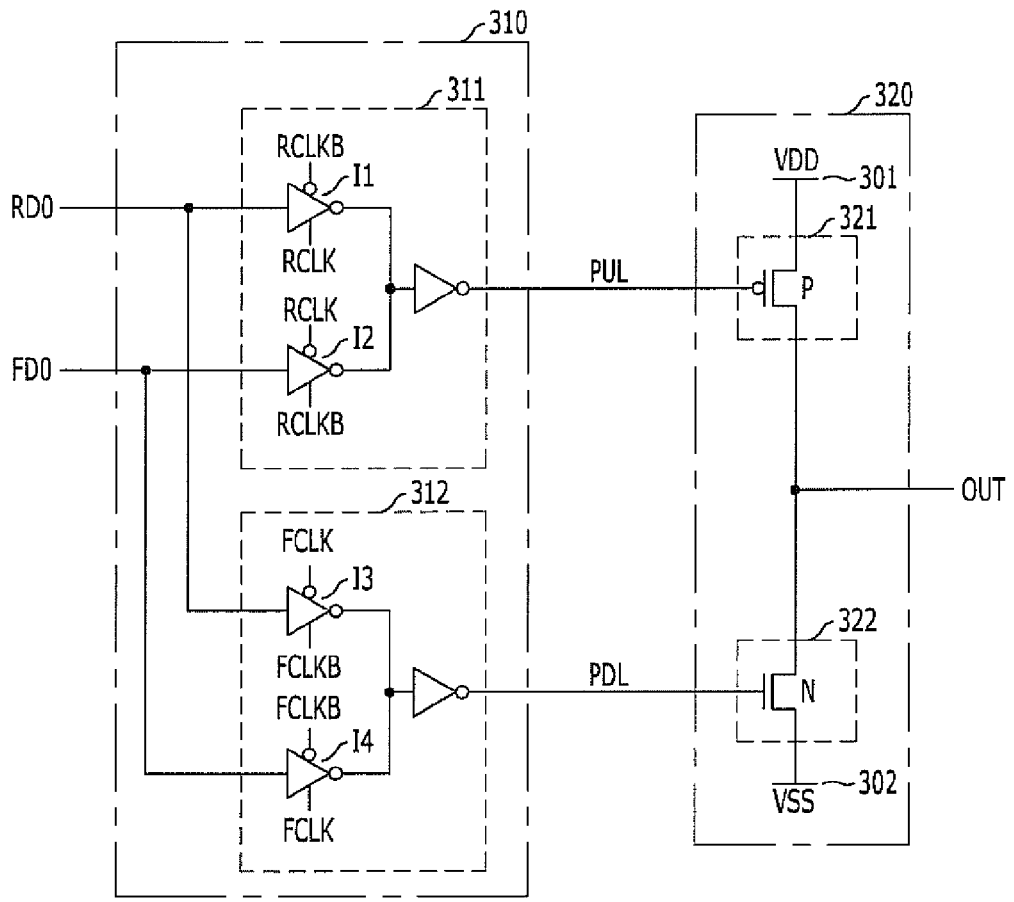
FIG. 3 is a configuration diagram of a signal output circuit in accordance with an exemplary embodiment of the present invention.
Figure 3:
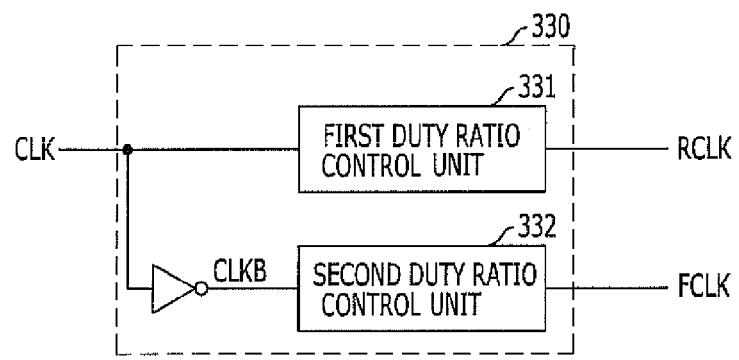

FIG. 3 is a configuration diagram of a signal output circuit in accordance with an exemplary embodiment of the present invention.

Referring to FIG. 3, the signal output circuit includes a signal transfer unit 310 configured to transfer the signal of a first line RDO to a pull-up line PUL during the activation period of a first clock RCLK and to a pull-down line PDL during the deactivation period of a second clock FCLK, and transfer the signal of a second line FDO to the pull-up line PUL during the deactivation period of the first clock RCLK and to the pull-down line PDL during the activation period of the second clock FCLK, an output driving unit 320 configured to pull-up drive an output node OUT in response to the signal of the pull-up line PUL and pull-down drive the output node OUT in response to the signal of the pull-down line PDL, and a duty ratio control unit 330 configured to generate the first clock RCLK by controlling the duty ratio of a reference clock CLK and generate the second clock FCLK by controlling the duty ratio of an inverted clock CLKB of the reference clock CLK or inverting a resultant signal obtained by controlling the duty ratio of the reference clock CLK. The activation periods of the first clock RCLK and the second clock FCLK are longer than the deactivation periods thereof. The reference clock CLK may be, but not limited to, a clock which is supplied to the signal output circuit and of which duty ratio is near to 1:1.

Hereinafter, operations of the signal output circuit will be described with reference to FIG. 3.

The signal transfer unit 310 transfers the signal of the first line RDO to the pull-up line PUL during the activation period of the first clock RCLK and transfers the signal of the first line RDO to the pull-down line PDL during the deactivation period of the second clock FCLK. Also, the signal transfer unit 310 transfers the signal of the second line FDO to the pull-up line PUL during the deactivation period of the first clock RCLK and transfers the signal of the second line FDO to the pull-down line PDL during the activation period of the second clock FCLK. The signal transfer unit 310 may invert the signals of the first line RDO and the second line FDO and transfer resultant signals to the pull-up line PUL and the pull-down line PDL or may transfer the signals of the first line RDO and the second line FDO to the pull-up line PUL and the pull-down line PDL as they are. Hereinbelow, the former case will be described as an example. Depending on whether inversion is made or not, the logic value of a signal (hereinafter, referred to as an output signal OUT) outputted to the output node OUT may be the same as or opposite to the logic value of the signal of the first line RDO or the second line FDO. This may be changed depending upon different designs.

For this operation, the signal transfer unit 310 includes a pull-up transfer unit 311 configured to transfer the signal of the first line RDO to the pull-up line PUL during the activation period of the first clock RCLK and transfer the signal of the second line FDO to the pull-up line PUL during the deactivation period of the first clock RCLK, and a pull-down transfer unit 312 configured to transfer the signal of the first line RDO to the pull-down line PDL during the deactivation period of the second clock FCLK and transfer the signal of the second line FDO to the pull-down line PDL during the activation period of the second clock FCLK. In FIG. 3, RCLKB designates the inverted clock of the first clock RCLK, and FCLKB designates the inverted clock of the second clock FCLK.

For reference, the pull-up transfer unit 311 may include an inverter I1 which is activated during the activation period of the first clock RCLK and inverts the signal of the first line RDO and an inverter I2 which is activated during the deactivation period of the first clock RCLK and inverts the signal of the second line FDO. The pull-down transfer unit 312 may include an inverter I3 which is activated during the deactivation period of the second clock FCLK and inverts the signal of the first line RDO and an inverter I4 which is activated during the activation period of the second clock FCLK and inverts the signal of the second line FDO. The pull-up transfer unit 311 and the pull-down transfer unit 312 may also include pass gates.

The output driving unit 320 pull-up drives the output node OUT in response to the signal of the pull-up line PUL (that is, when the logic value of the signal of the pull-up line PUL is low) and pull-down drives the output node OUT in response to the signal of the pull-down line PDL (that is, when the logic value of the signal of the pull-down line PDL is high). If the output node OUT is pull-up driven, the logic value of the output signal OUT outputted to the output node OUT becomes high, and if the output node OUT is pull-down driven, the logic value of the output signal OUT becomes low.

For this operation, the output driving unit 320 may include a pull-up driving unit 321 including a PMOS transistor P having one end which is connected to the output node OUT, the other end to which a power supply voltage VDD is applied and a gate to which the signal of the pull-up line PUL is inputted and a pull-down driving unit 322 including an NMOS transistor N having one end which is connected to the output node OUT, the other end to which a ground voltage VSS is applied and a gate to which the signal of the pull-down line PDL is inputted. In order to control a driving force for driving the output node OUT, the pull-up driving unit 321 may include one or more PMOS transistors and the pull-down driving unit 322 may include one or more NMOS transistors.

If the logic values of the signals of the pull-up line PUL and the pull-down line PDL are low, the PMOS transistor P is turned on and the NMOS transistor N is turned off, by which the output node OUT is pull-up driven (the logic value of the output signal OUT becomes high). If the logic values of the signals of the pull-up line PUL and the pull-down line PDL are high, the PMOS transistor P is turned off and the NMOS transistor N is turned on, by which the output node OUT is pull-down driven (the logic value of the output signal OUT becomes low).

The duty ratio control unit 330 generates the first clock RCLK by controlling the duty ratio of the reference clock CLK and generates the second clock FCLK by controlling the duty ratio of the inverted clock CLKB of the reference clock CLK. The activation periods of the first clock RCLK and the second clock FCLK are longer than the deactivation periods thereof. The first clock RCLK may be generated by controlling the high level period of the reference clock CLK, and the second clock FCLK may be generated by controlling the high level period of the inverted clock CLKB or inverting a resultant signal obtained by controlling the low level period of the reference clock CLK.

For this operation, the duty ratio control unit 330 may include a first duty ratio control unit 331 configured to generate the first clock RCLK by controlling the duty ratio of the reference clock CLK and a second duty ratio control unit 332 configured to generate the second clock FCLK by controlling the duty ratio of the inverted clock CLKB or inverting a resultant signal obtained by controlling the duty ratio of the reference clock CLK (FIG. 3 shows the case where the second clock FCLK is generated by controlling the duty ratio of the inverted clock CLKB). The first and second duty ratio control units 331 and 332 may control the duty ratio of the reference clock CLK using various methods.

At least one of the first duty ratio control unit 331 and the second duty ratio control unit 332 may make the activation period of its output clock longer than the deactivation period by controlling at least one of the slew rate of the rising edge and the slew rate of the falling edge of its input clock. For such a method, reference may be made to Korean Patent No. 10-1030275 entitled 'Duty Correction Circuit and Clock Correction Circuit Including the Same'. As the slew rate of the rising edge increases or the slew rate of the falling edge decreases, a high level period is lengthened, and as the slew rate of the rising edge decreases or the slew rate of the falling edge increases, a high level period is shortened.

At least one of the first duty ratio control unit 331 and the second duty ratio control unit 332 may make the activation period of its output clock longer than the deactivation period by controlling the voltage level of its input clock. For example, if the level of the entire input clock is raised, the high level period of the output clock may be lengthened since a period of the output clock recognized as a high logic value is lengthened. Conversely, if the level of the entire input clock is lowered, the low level period of the output clock may be lengthened since a period of the output clock recognized as a low logic value is lengthened. For such a method, reference may be made to Korean Patent Application No. 10-2007-0114975 entitled 'Duty Correction Circuit of Semiconductor Memory Device'.

At least one of the first duty ratio control unit 331 and the second duty ratio control unit 332 may make the activation period of its output clock longer than the deactivation period by using its input clock and a delayed clock of the input clock. For such a method, reference may be made to Korean Patent No. 10-1053543 entitled 'Clock Duty Correction Circuit'. Furthermore, as a simple example, the high level period may be lengthened by combining the input clock and the delayed clock with an OR gate.

Circuits using various methods other than the above-described methods may be used as the first duty ratio control unit 331 and the second duty ratio control unit 332 to generate an output clock by controlling the duty ratio of an input clock.

Figure 4:
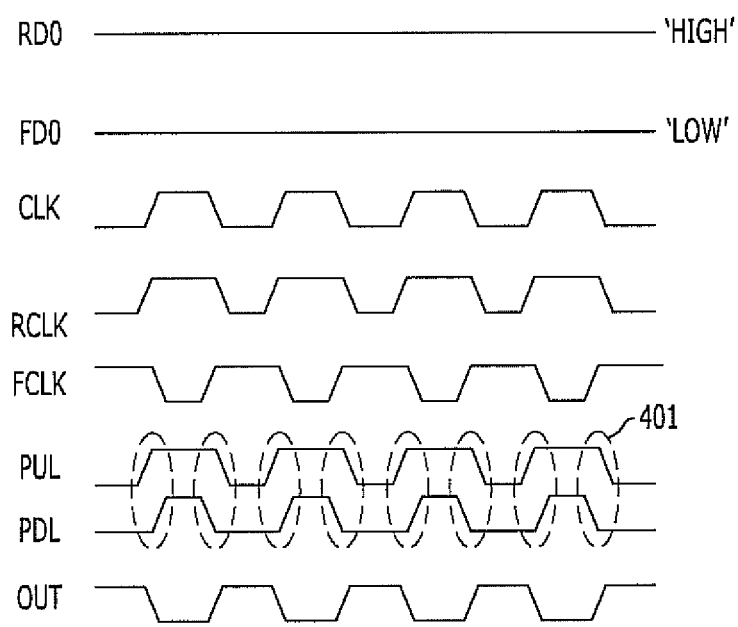
FIG. 4 is a waveform diagram illustrating operations of the signal output circuit shown in FIG. 3.

FIG. 4 is a waveform diagram illustrating operations of the signal output circuit shown in FIG. 3.

Hereinbelow, procedures in which the signals of the first line RDO and the second line FDO are outputted to the output node OUT in the signal output circuit shown in FIG. 3 will be described with reference to FIGS. 3 and 4. For the sake of convenience in explanation, it is described as an example that the logic value of the signal of the first line RDO is high and the logic value of the signal of the second line FDO is low.

The procedure in which the signal of the first line RDO with the high logic value is outputted is as follows.

Since the signal of the first line RDO is transferred to the pull-up line PUL by the pull-up transfer unit 311 during the activation period of the first clock RCLK, the logic value of the signal of the pull-up line PUL becomes high during the activation period of the first clock RCLK. Meanwhile, since the signal of the first line RDO is transferred to the pull-down line PDL by the pull-down transfer unit 312 during the deactivation period of the second clock FCLK, the logic value of the signal of the pull-down line PDL becomes high during the deactivation period of the second clock FCLK. Accordingly, the PMOS transistor P included in the output driving unit 320 is turned off during the activation period of the first clock RCLK, and the NMOS transistor N included in the output driving unit 320 is turned on during the deactivation period of the second clock FCLK. Because the output node OUT is pull-down driven while the NMOS transistor N is turned on, the logic value of the output signal OUT becomes low (the logic value of the signal of the first line RDO is inverted).

As can be seen from FIG. 4, since the activation period of the first clock RCLK is longer than and includes/covers the deactivation period of the second clock FCLK, the PMOS transistor P is turned off in advance before the NMOS transistor N is turned on and is turned on after the NMOS transistor N is turned off. Therefore, during a period in which the NMOS transistor N is turned on, the PMOS transistor P is stably maintained in a turned-off state.

The procedure in which the signal of the second line FDO with the low logic value is outputted is as follows.

Since the signal of the second line FDO is transferred to the pull-up line PUL by the pull-up transfer unit 311 during the deactivation period of the first clock RCLK, the logic value of the signal of the pull-up line PUL becomes low during the deactivation period of the first clock RCLK. Meanwhile, since the signal of the second line FDO is transferred to the pull-down line PDL by the pull-down transfer unit 312 during the activation period of the second clock FCLK, the logic value of the signal of the pull-down line PDL becomes low during the activation period of the second clock FCLK. Accordingly, the PMOS transistor P included in the output driving unit 320 is turned on during the deactivation period of the first clock RCLK, and the NMOS transistor N included in the output driving unit 320 is turned off during the activation period of the second clock FCLK. Because the output node OUT is pull-up driven while the PMOS transistor P is turned on, the logic value of the output signal OUT becomes high (the logic value of the signal of the second line FDO is inverted).

As can be seen from FIG. 4, since the activation period of the second clock FCLK is longer than and includes/covers the deactivation period of the first clock RCLK, the NMOS transistor N is turned off in advance before the PMOS transistor P is turned on and is turned on after the PMOS transistor P is turned off. Therefore, during a period in which the PMOS transistor P is turned on, the NMOS transistor N is always stably maintained in a turned-off state.

In the embodiment of the present invention, unlike the conventional signal output circuit, the rising edge and falling edge of the signal of the pull-up line PUL do not overlap with the rising edge and falling edge of the signal of the pull-down line PDL. Therefore, as described above, since one of the PMOS transistor P and the NMOS transistor N is turned on while the other is stably maintained in a turned-off state, short current is prevented from flowing from a power supply voltage terminal 301 to a ground voltage terminal 302, whereby power consumption due to short current may be reduced.

Figure 5:
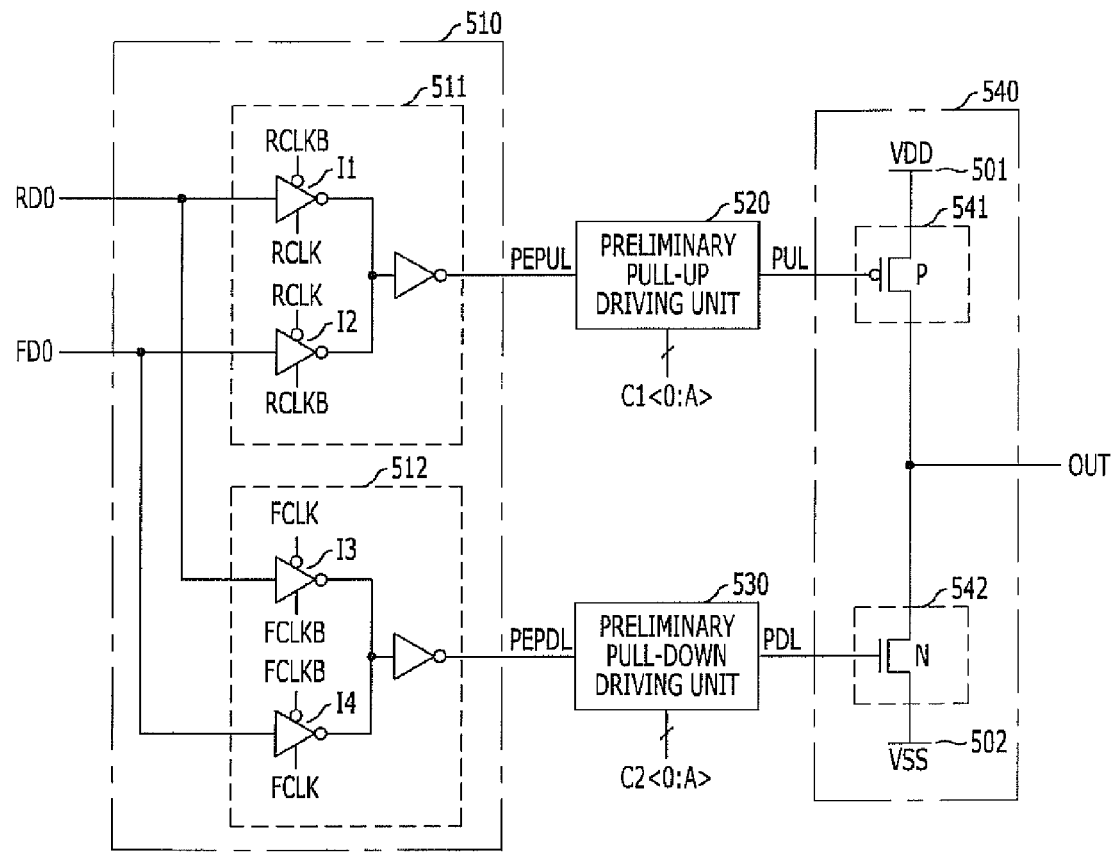
FIG. 5 is a configuration diagram of a signal output circuit in accordance with another exemplary embodiment of the present invention.
Figure 5:
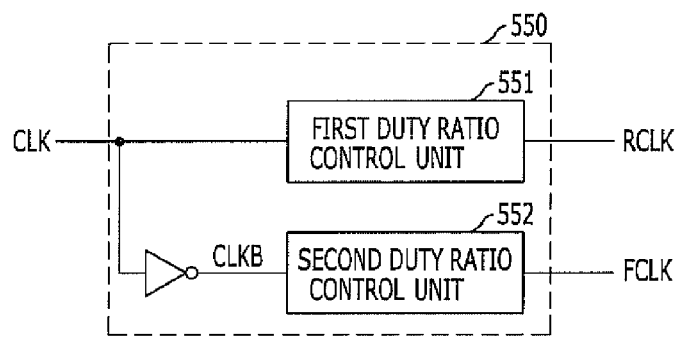

FIG. 5 is a configuration diagram of a signal output circuit in accordance with another embodiment of the present invention. When compared to the signal output circuit shown in FIG. 3, the signal output circuit shown in FIG. 5 further includes preliminary driving units 520 and 530.

The preliminary driving units 520 and 530 are component elements for driving an output driving unit 540. By controlling the driving forces of the preliminary driving units 520 and 530, the slew rate of a signal outputted to an output node OUT may be controlled. As the driving forces of the preliminary driving units 520 and 530 become large, the slew rate of the signal outputted to the output node OUT increases, and as the driving forces of the preliminary driving units 520 and 530 become small, the slew rate of the signal outputted to the output node OUT decreases.

Referring to FIG. 5, the signal output circuit includes a signal transfer unit 510 configured to transfer the signal of a first line RDO to a preliminary pull-up line PEPUL during the activation period of a first clock RCLK and to a preliminary pull-down line PEPDL during the deactivation period of a second clock FCLK, and transfer the signal of a second line FDO to the preliminary pull-up line PEPUL during the deactivation period of the first clock RCLK and to the preliminary pull-down line PEPDL during the activation period of the second clock FCLK, a preliminary pull-up driving unit 520 configured to drive the signal of the preliminary pull-up line PEPUL to a pull-up line PUL with a driving force determined by first codes C1<0:A>, a preliminary pull-down driving unit 530 configured to drive the signal of the preliminary pull-down line PEPDL to a pull-down line PDL with a driving force determined by second codes C2<0:A>, an output driving unit 540 configured to pull-up drive the output node OUT in response to the signal of the pull-up line PUL and pull-down drive the output node OUT in response to the signal of the pull-down line PDL, and a duty ratio control unit 550 configured to generate the first clock RCLK by controlling the duty ratio of a reference clock CLK and generate the second clock FCLK by controlling the duty ratio of an inverted clock CLKB of the reference clock CLK. The activation periods of the first clock RCLK and the second clock FCLK are longer than the deactivation periods thereof. The reference clock CLK may be, but not limited to, a clock which is supplied to the signal output circuit and of which duty ratio is near to 1:1.

Hereinafter, operations of the signal output circuit will be described with reference to FIG. 5.

Since the configuration and operation of the signal transfer unit 510 are the same as those of the signal transfer unit 310 shown in FIG. 3 except that the signal transfer unit 510 transfers the signals of the first line RDO and the second line FDO not to the pull-up line PUL and the pull-down line PDL but to the preliminary pull-up line PEPUL and the preliminary pull-down line PEPDL, detailed descriptions thereof will be omitted here.

The preliminary pull-up driving unit 520 is a driver which drives the signal of the preliminary pull-up line PEPUL to the pull-up line PUL with the driving force determined by the first codes C1<0:A>. The driving force of the preliminary pull-up driving unit 520 is controlled by the first codes C1<0:A>, and as a result, the slew rate of the rising edge of the signal of the output node OUT may be controlled. The first codes C1<0:A> may be a binary code of at least one bit which is determined by PVT (process, voltage and temperature) conditions, the number of output pads, etc.

The preliminary pull-down driving unit 530 is a driver which drives the signal of the preliminary pull-down line PEPDL to the pull-down line PDL with the driving force determined by the second codes C2<0:A>. The driving force of the preliminary pull-down driving unit 530 is controlled by the second codes C2<0:A>, and as a result, the slew rate of the falling edge of the signal of the output node OUT may be controlled. The second codes C2<0:A> may be a binary code of at least one bit which is determined by PVT conditions, the number of output pads, etc.

The preliminary pull-up and pull-down driving units 520 and 530 drive the signals of the preliminary pull-up and pull-down lines PEPUL and PEPDL to the pull-up and pull-down lines PUL and PDL without inversion. However, in the case where the signal transfer unit 510 transfers the signals of the first line RDO and the second line FDO to the preliminary pull-up and pull-down lines PEPUL and PEPDL without inversion, the preliminary pull-up and pull-down driving units 520 and 530 may invert the signals of the preliminary pull-up and pull-down lines PEPUL and PEPDL and drive resultant signals to the pull-up and pull-down lines PUL and PDL. This may be selected depending upon different designs.

Since the configurations and operations of the output driving unit 540 and the duty ratio control unit 550 are the same as those of the output driving unit 320 and the duty ratio control unit 330 of the signal output circuit shown in FIG. 3, detailed descriptions thereof will be omitted here.

The signal output circuit shown in FIG. 5 may reduce power consumption through decreasing short current similar to the signal output circuit shown in FIG. 3.

Each of the signal output circuits shown in FIGS. 3 and 5 may be a data output circuit included in a semiconductor memory device. In the event that the signal output circuit according to the embodiments of the present invention is a data output circuit included in a semiconductor memory device, the first line RDO serves as a first data transfer line, and the signal of the first line RDO is rising data which is outputted during the activation period of a rising clock RCLK. Also, the second line FDO serves as a second data transfer line, and the signal of the second line FDO is falling data which is outputted during the activation period of a falling clock FCLK.

Figure 6:
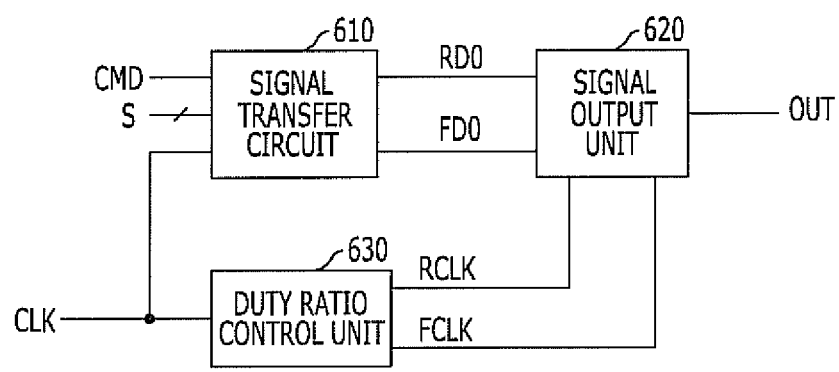
FIG. 6 is a configuration diagram of a semiconductor device in accordance with another exemplary embodiment of the present invention.

FIG. 6 is a configuration diagram of a semiconductor device in accordance with another embodiment of the present invention.

Referring to FIG. 6, the semiconductor device includes a signal transfer circuit 610 configured to transfer a first signal to a first line RDO and a second signal to a second line FDO in synchronization with a reference clock CLK when an enable signal EN (or a command CMD) is applied, a signal output unit 620 configured to output the signals transferred to the first line RDO and the second line FDO to an output node OUT in synchronization with a first clock RCLK and a second clock FCLK, and a duty ratio control unit 630 configured to generate the first clock RCLK by controlling the duty ratio of the reference clock CLK and generate the second clock FCLK by controlling the duty ratio of an inverted clock CLKB of the reference clock CLK or inverting a resultant signal obtained by controlling the duty ratio of the reference clock CLK.

The semiconductor device in accordance with the present embodiment of the present invention will be described with reference to FIG. 6.

The signal transfer circuit 610 transfers the first signal to the first line RDO and the second signal to the second line FDO in response the enable signal EN. The enable signal EN controls the signal transfer circuit 610 to transfer some of signals S inputted to the signal transfer circuit 610 to the first line RDO and the second line FDO or to transfer some of signals generated by the signal transfer circuit 610 to the first line RDO and the second line FDO. Therefore, the signals S inputted to the signal transfer circuit 610 or the signals generated by the signal transfer circuit 610 may include the first signal and the second signal. In the case where the semiconductor device is a memory, these signals may be data.

The signal transfer circuit 610 transfers the first signal to the first line RDO and the second signal to the second line FDO in synchronization with the reference clock CLK. The first signal and the second signal may be the signals which are generated by the signal transfer circuit 610 in response to the enable signal EN and may be the signals S which are generated externally and are transferred to the signal transfer circuit 610. The reference clock CLK may be a clock which is inputted through an input buffer circuit (not shown) from an outside of a semiconductor memory device.

In the case where the semiconductor device is a semiconductor memory device, the signal transfer circuit 610 may be a circuit which is disposed on a path through which the data outputted from a memory cell passes to be transferred to the signal output unit 620 (corresponding to a data output circuit of the semiconductor memory device) and operates in synchronization with the reference clock CLK. For example, the signal transfer circuit 610 may constitute a portion of a parallel-to-serial conversion circuit which converts data transferred in parallel through a plurality of global lines into serial data in synchronization with the reference clock CLK.

The signal output unit 620 outputs the signals transferred to the first line RDO and the second line FDO to the output node OUT in synchronization with the first clock RCLK and the second clock FCLK. The configurations of the signal output unit 620 and the duty ratio control unit 630 are the same as those of the signal output circuit shown in FIG. 3 or the signal output circuit shown in FIG. 5. The signal output unit 620 may include the signal transfer unit 310 and the output driving unit 320 shown in FIG. 3 or the signal transfer unit 510, the preliminary pull-up driving unit 520, the preliminary pull-down driving unit 530 and the output driving unit 540 shown in FIG. 5. In the former case, operations of the signal output unit 620 are the same as those described above with reference to FIG. 3, and in the latter case, operations of the signal output unit 620 are the same as those described above with reference to FIG. 5. The configuration and operations of the duty ratio control unit 630 are the same as those of the duty ratio control unit 330 of the signal output circuit shown in FIG. 3.

The semiconductor device shown in FIG. 6 may reduce power consumption through decreasing short current as in the signal output circuit shown in FIG. 3.

As apparent from the above descriptions, in the signal output circuit according to the present invention, since the activation periods of a pull-up driving unit and a pull-down driving unit do not overlap with each other, short current is not generated, thereby reducing power consumption.

While the present invention has been described with respect to the specific embodiments, it will be apparent to those skilled in the art that various changes and modifications may be made without departing from the spirit and scope of the invention as defined in the following claims.

What is claimed is:

1. A signal output circuit comprising:
   a signal transfer unit configured to transfer a signal of a first line to a pull-up line during an activation period of a first clock, transfer the signal of the first line to a pull-down line during a deactivation period of a second clock, transfer a signal of a second line to the pull-up line during a deactivation period of the first clock, and transfer the signal of the second line to the pull-down line during an activation period of the second clock; and
   an output driving unit configured to pull-up drive an output node in response to a signal of the pull-up line and pull-down drive the output node in response to a signal of the pull-down line,
   wherein the first clock and the second clock have the activation periods longer than the deactivation periods.

2. The signal output circuit of claim 1, wherein the first clock is generated by controlling a duty ratio of a reference clock, and the second clock is generated by controlling a duty ratio of an inverted clock of the reference clock or inverting a resultant clock obtained by controlling the duty ratio of the reference clock.

3. The signal output circuit of claim 2, wherein the first clock is generated by lengthening an activation period of the reference clock, and the second clock is generated by lengthening an activation period of the inverted clock the same as in lengthening the activation period of the reference clock.

4. The signal output circuit of claim 1, wherein the signal transfer unit comprises:
   a pull-up transfer unit configured to transfer the signal of the first line to the pull-up line during the activation period of the first clock and transfer the signal of the second line to the pull-up line during the deactivation period of the first clock; and
   a pull-down transfer unit configured to transfer the signal of the first line to the pull-down line during the deactivation period of the second clock and transfer the signal of the second line to the pull-down line during the activation period of the second clock.

5. The signal output circuit of claim 2, wherein the signal output circuit includes a data output circuit, the signal of the first line includes data which is outputted during an activation period of the reference clock, and the signal of the second line includes data which is outputted during a deactivation period of the reference clock.

6. The signal output circuit of claim 1, wherein the output driving unit comprises:
- a pull-up driving unit including a PMOS transistor having one end which is connected to the output node, the other end to which a power supply voltage is applied, and a gate to which the signal of the pull-up line is inputted; and
- a pull-down driving unit including an NMOS transistor having one end which is connected to the output node, the other end to which a ground voltage is applied, and a gate to which the signal of the pull-down line is inputted.

7. A signal output circuit comprising:
- a duty ratio control unit configured to generate a first clock and a second clock by controlling a duty ratio of a reference clock and a duty ratio of an inverted clock of the reference clock, respectively;
- a signal transfer unit configured to transfer a signal of a first line to a pull-up line during an activation period of the first clock, transfer the signal of the first line to a pull-down line during a deactivation period of the second clock, transfer a signal of a second line to the pull-up line during a deactivation period of the first clock, and transfer the signal of the second line to the pull-down line during an activation period of the second clock; and
- an output driving unit configured to pull-up drive an output node in response to a signal of the pull-up line and pull-down drive the output node in response to a signal of the pull-down line,
- wherein the first clock and the second clock have the activation periods longer than the deactivation periods.

8. The signal output circuit of claim 7, wherein the signal transfer unit comprises:
- a pull-up transfer unit configured to transfer the signal of the first line to the pull-up line during the activation period of the first clock and transfer the signal of the second line to the pull-up line during the deactivation period of the first clock; and
- a pull-down transfer unit configured to transfer the signal of the first line to the pull-down line during the deactivation period of the second clock and transfer the signal of the second line to the pull-down line during the activation period of the second clock.

9. The signal output circuit of claim 7, wherein the duty ratio control unit comprises:
- a first duty ratio control unit configured to generate the first clock by lengthening an activation period of the reference clock; and
- a second duty ratio control unit configured to generate the second clock by lengthening an activation period of the inverted clock of the reference clock the same as the first duty ratio control unit.

10. The signal output circuit of claim 9, wherein at least one of the first duty ratio control unit and the second duty ratio control unit outputs an output clock having an activation period longer than a deactivation period by controlling at least one of a slew rate of a rising edge and a slew rate of a falling edge of an input clock inputted thereto.

11. The signal output circuit of claim 9, wherein at least one of the first duty ratio control unit and the second duty ratio control unit outputs an output clock having an activation period longer than a deactivation period by controlling a voltage level of an input clock inputted thereto.

12. The signal output circuit of claim 9, wherein at least one of the first duty ratio control unit and the second duty ratio control unit outputs an output clock having an activation period longer than a deactivation period by using an input clock inputted thereto and a delayed clock of the input clock.

13. A signal output circuit comprising:
- a signal transfer unit configured to transfer a signal of a first line to a preliminary pull-up line during an activation period of a first clock, transfer the signal of the first line to a preliminary pull-down line during a deactivation period of a second clock, transfer a signal of a second line to the preliminary pull-up line during a deactivation period of the first clock, and transfer the signal of the second line to the preliminary pull-down line during an activation period of the second clock;
- a preliminary pull-up driving unit configured to drive a signal of the preliminary pull-up line to a pull-up line with a driving force determined by first codes;
- a preliminary pull-down driving unit configured to drive a signal of the preliminary pull-down line to a pull-down line with a driving force determined by second codes; and
- an output driving unit configured to pull-up drive an output node in response to a signal of the pull-up line and pull-down drive the output node in response to a signal of the pull-down line,
- wherein the first clock and the second clock have the activation periods longer than the deactivation periods.

14. The signal output circuit of claim 13, wherein the first clock is generated by controlling a duty ratio of a reference clock, and the second clock is generated by controlling a duty ratio of an inverted clock of the reference clock or inverting a resultant clock obtained by controlling the duty ratio of the reference clock.

15. The signal output circuit of claim 14, wherein the signal transfer unit comprises:
- a pull-up transfer unit configured to transfer the signal of the first line to the preliminary pull-up line during the activation period of the first clock and transfer the signal of the second line to the preliminary pull-up line during the deactivation period of the first clock; and
- a pull-down transfer unit configured to transfer the signal of the first line to the preliminary pull-down line during the deactivation period of the second clock and transfer the signal of the second line to the preliminary pull-down line during the activation period of the second clock.

16. The signal output circuit of claim 13, wherein a slew rate of a rising edge of a signal outputted to the output node is controlled in response to the first codes, and a slew rate of a falling edge of the signal outputted to the output node is controlled in response to the second codes.

17. A signal output circuit comprising:
- a duty ratio control unit configured to generate a first clock and a second clock by controlling a duty ratio of a reference clock and a duty ratio of an inverted clock of the reference clock, respectively;
- a signal transfer unit configured to transfer a signal of a first line to a preliminary pull-up line during an activation period of the first clock, transfer the signal of the first line to a preliminary pull-down line during a deactivation period of the second clock, transfer a signal of a second line to the preliminary pull-up line during a deactivation period of the first clock, and transfer the signal of the second line to the preliminary pull-down line during an activation period of the second clock;
- a preliminary pull-up driving unit configured to drive a signal of the preliminary pull-up line to a pull-up line with a driving force determined by first codes;

a preliminary pull-down driving unit configured to drive a signal of the preliminary pull-down line to a pull-down line with a driving force determined by second codes; and an output driving unit configured to pull-up drive an output node in response to a signal of the pull-up line and pull-down drive the output node in response to a signal of the pull-down line, wherein the first clock and the second clock have the activation periods longer than the deactivation periods.

18. A semiconductor device comprising:

a signal transfer circuit configured to transfer a first signal to a first line and a second signal to a second line in synchronization with a reference clock when an enable signal is applied;

a duty ratio control unit configured to generate a first clock and a second clock by controlling a duty ratio of a reference clock and a duty ratio of an inverted clock of the reference clock, respectively;

a signal transfer unit configured to transfer a signal of the first line to a pull-up line during an activation period of the first clock, transfer the signal of the first line to a pull-down line during a deactivation period of the second clock, transfer a signal of the second line to the pull-up line during a deactivation period of the first clock, and transfer the signal of the second line to the pull-down line during an activation period of the second clock; and an output driving unit configured to pull-up drive an output node in response to a signal of the pull-up line and pull-down drive the output node in response to a signal of the pull-down line, wherein the first clock and the second clock have the activation periods longer than the deactivation periods.

19. A semiconductor device comprising:

a signal transfer circuit configured to transfer a first signal to a first line and a second signal to a second line in synchronization with a reference clock when an enable signal is applied;

a duty ratio control unit configured to generate a first clock and a second clock by controlling a duty ratio of a reference clock and a duty ratio of an inverted clock of the reference clock, respectively;

a signal transfer unit configured to transfer a signal of the first line to a preliminary pull-up line during an activation period of the first clock, transfer the signal of the first line to a preliminary pull-down line during a deactivation period of the second clock, transfer a signal of the second line to the preliminary pull-up line during a deactivation period of the first clock, and transfer the signal of the second line to the preliminary pull-down line during an activation period of the second clock;

a preliminary pull-up driving unit configured to drive a signal of the preliminary pull-up line to a pull-up line with a driving force determined by first codes;

a preliminary pull-down driving unit configured to drive a signal of the preliminary pull-down line to a pull-down line with a driving force determined by second codes; and an output driving unit configured to pull-up drive an output node in response to a signal of the pull-up line and pull-down drive the output node in response to a signal of the pull-down line, wherein the first clock and the second clock have the activation periods longer than the deactivation periods.

\* \* \* \* \*